(12) United States Patent
Takahashi et al.

(10) Patent No.: US 7,595,694 B2
(45) Date of Patent: Sep. 29, 2009

(54) ELECTRONICS PARTS FOR HIGH FREQUENCY POWER AMPLIFIER

(75) Inventors: Kyoichi Takahashi, Fujioka (JP); Takayuki Tsutsui, Saku (JP); Hitoshi Akamine, Maebashi (JP); Fuminori Morisawa, Takasaki (JP); Nobuhiro Matsudaira, Chigasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/071,203

(22) Filed: Feb. 19, 2008

(65) Prior Publication Data

US 2008/0150637 A1     Jun. 26, 2008

Related U.S. Application Data

(63) Continuation of application No. 11/360,437, filed on Feb. 24, 2006.

(30) Foreign Application Priority Data

Feb. 28, 2005     (JP) .............................. 2005-052290

(51) Int. Cl.
    H03G 3/30     (2006.01)
(52) U.S. Cl. .................... 330/285; 330/129; 330/279
(58) Field of Classification Search .............. 330/129, 330/133, 134, 141, 279, 285, 310
    See application file for complete search history.

(56) References Cited

U.S. PATENT DOCUMENTS 6,924,698 B2 *   8/2005   Camnitz et al. ............. 330/285
6,972,626 B2 *  12/2005   Takahashi et al. ........... 330/285

FOREIGN PATENT DOCUMENTS

JP     2000-151310         5/2000

OTHER PUBLICATIONS

"SKY77324: iPAC™ PAM for Quad-Band GSSM/GPRS", published by Skyworks, Jan. 2004.

* cited by examiner

Primary Examiner—Khanh V Nguyen
(74) Attorney, Agent, or Firm—Mattingly & Malur, P.C.

(57) ABSTRACT

This invention provides an electronic part for high frequency power amplification (RF power module) which will automatically perform the precharge level setting for proper output power at start of transmission without requiring the software process for precharging to run on the baseband IC, which can reduce the burden on users, namely, mobile phone manufacturers. Such electronic part configured to amplify RF transmit signals includes an output power control circuit which supplies an output power control voltage to a bias control circuit in a high frequency power amplifier circuit, based on an output power level directive signal. This electronic part is equipped with a precharge circuit which raises the output power control voltage to produce a predetermined level of output power, while detecting a current flowing through a final-stage power amplifying element, triggered by rise of a supply voltage at start of transmission.

12 Claims, 9 Drawing Sheets

ELECTRONICS PARTS FOR HIGH FREQUENCY POWER AMPLIFIER

This application is a continuation application of U.S. application Ser. No. 11/360,437, filed Feb. 24, 2006, now U.S. Pat. No. 7,352,244.

CROSS-REFERENCE TO RELATED APPLICATION

The present application claims priority from Japanese patent application No. 2005-052290 filed on Feb. 28, 2005, the content of which is hereby incorporated by reference into this application.

BACKGROUND OF THE INVENTION

The present invention relates to a technique for improving the startup of a power control loop at start of transmission in an electronic part for high frequency power amplification (RF power module) including a high frequency power amplifier circuit. In particular, the invention relates to the above technique that is effectively applied to the RF power module for use in, for example, mobile phones for GSM networks.

A transmitter output section of a wireless communication apparatus (mobile communication apparatus) such as a mobile phone has an electronic part for high frequency power amplification (hereinafter referred to as RF power module) having built therein a high frequency power amplifier circuit (PA) with a transistor such as a MOSFET (Metal Oxide Semiconductor Field-Effect-Transistor) or a GaAs-MESFET as an amplifying element.

A mobile communication system is generally configured such that a mobile phone during a call with another one changes its output power (transmitting power) adaptively to its ambient environment, according to information indicating a proper power level sent from a base station, thus preventing interference with other mobile phones. For example, a mobile phone of GSM (Global System for Mobile Communications) is configured as follows: it employs an Automatic Power Control (APC) circuit that compares an output signal detected with an output level directive signal Vramp from a baseband circuit and generates a control voltage Vapc to control the transmitting power and the gains of amplification stages of a high frequency power amplifier circuit in its transmitter output section are controlled by a bias control circuit to produce an output power required to continue a call in accordance with the control voltage Vapc (Patent document 1).

For a mobile phone for GSM employing a conventional RF power module, when the output level directive signal Vramp supplied from the baseband circuit rapidly rises to a transmitting power level at start of transmission, the output power of the high frequency power amplifier circuit rises at an excessively high rate, which causes a part of the spectrum characteristic of its output signal to fall outside the range prescribed by GSM standards. Specifically, the GSM standards prescribe that, in the spectrum characteristic of an output signal, the signal strength must be lower than its profile plotted by a dashed line A shown in FIG. 11(A). However, a problem was found in the actual output signal profile plotted by a solid line B; that is, the signal strength exceeds the prescribed profile in the foot of the rising waveform that represents the characteristic.

To address this problem, as is illustrated in FIG. 2 (A), a technique is disclosed (non-patent document 1), whereby, for a period (t1 to t5) after the power-on of the RF power module until the output level directive signal Vramp starts to rise, as preparation for transmission, a "precharge" operation (t4 to t5) that raises the voltage Vramp (Vapc) to a level equivalent to −25 to −30 dBm of output power and holds it for a short period of time such as 15 to 17 μsec is performed by a software process run on the baseband IC.

[Patent document 1] Japanese Unexamined Patent Publication No. 2000-151310

[Non-patent document 1] Data Sheet "SKY77324: iPACTM PAM for Quad-Band GSSM/GPRS" published by SKYWORKS

SUMMARY OF THE INVENTION

As for the prior art technique that raises the output level directive signal Vramp by the software process run on the baseband IC and precharges the power amplifier (PA), the manufacturers of mobile phones having specific functions which are implemented by combining the RF power module and the baseband IC must program the process for precharging. Consequently, a problem of increasing the burden on mobile phone manufacturers is posed. That is, when changing either the RF module or the baseband IC used in a mobile phone model, its manufacturer must develop a program for controlling the baseband IC including the precharging process accordingly.

Moreover, the performance of the RF power module is dependent on manufacture variance, supply voltage, and temperature. Because the Vramp level setting for the precharging varies, depending on the manufacture variance, supply voltage level, and temperature, this setting (precharge level setting) must be adjusted for each mobile phone hardware. This also imposes a great burden on mobile phone manufacturers and posed a problem.

An object of this invention is to provide an electronic part for high frequency power amplification (RF power module) which will automatically perform the precharge level setting for proper output power at start of transmission without requiring the software process for precharging to run on the baseband IC and which can reduce the burden on users, namely, mobile phone manufacturers.

Another object of this invention is to provide an electronic part for high frequency power amplification (RF power module) which will accurately perform the precharge level setting for proper output power at start of transmission, not affected by manufacture variance, temperature change, or supply voltage change, even if they occur, while having the output power spectrum characteristic conforming to that prescribed by the standards.

The above and other objects and novel features of this invention will become apparent from the description of the present specification and the accompanying drawings.

A typical aspect of the invention disclosed herein will be summarized below.

An electronic part for high frequency power amplification to amplify RF transmit signals comprises a power amplifying element, a bias control circuit which applies a bias to the power amplifying element, an output power control circuit which supplies an output power control voltage to the bias control circuit, based on an output power level directive signal. This electronic part is equipped with a precharge circuit which raises the output power control voltage to produce a predetermined level of output power, while detecting a current flowing through a final-stage power amplifying element, triggered by rise of a supply voltage at start of transmission.

By the above means, the above electronic part can automatically perform the precharge level setting for proper output power at start of transmission without requiring the software process for precharging to run on the baseband IC. Because precharging is performed by using a feedback control loop, accurate precharging can be performed, not affected by manufacture variance, supply voltage change, or temperature change, even if they occur.

Preferably, the above electrical part further comprises an output power detecting circuit which detects output power and an error amplifier circuit which compares an output detected by the output power detecting circuit with the output power level directive signal and generates an output power control voltage to be supplied to the bias control circuit. The precharge circuit is configured to raise the output power control voltage to be output from the error amplifier circuit, triggered by rise of the supply voltage at start of transmission. Thereby, it will be possible to activate the precharge circuit, while putting a normal power control loop in an operating state; moreover, it will be possible to raise output power promptly and make a smooth transition to transmission operation.

Furthermore, preferably, the current detecting circuit is provided with a current clamp circuit which prevents a current exceeding a predetermined amount from flowing. Thereby, even if precharging is configured to be performed by feedback control, stable precharging can be performed.

Effects that will be achieved by a typical aspect of the present invention will be briefly described below.

According to the present invention, it is possible to realize an electronic part for high frequency power amplification (RF power module) which will automatically perform the precharge level setting for proper output power at start of transmission without requiring the software process for precharging to run on the baseband IC, which can reduce the burden on users, namely, mobile phone manufacturers, and which will accurately perform the precharge level setting for proper output power at start of transmission, not affected by manufacture variance, temperature change, or supply voltage change, even if they occur, while having the output power spectrum characteristic conforming to that prescribed by the standards.

BRIEF DESCRIPTION OF THE DRAWINGS

FIGS. 2(A) and 2(B) are timing charts, in which FIG. 2(A) is a timing chart representing how the potentials of internal nodes of a conventional RF power module change when transmission starts, and FIG. 2(B) is a timing chart representing how the potentials of internal nodes of an RF power module of the present embodiment change when transmission starts.

FIGS. 11(A) and 11(B) are output signal spectrum characteristic graphs, wherein FIG. 11(A) shows the spectrum characteristic of an output signal of a conventional RF power module, FIG. 11(B) shows the spectrum characteristic of an output signal of the RF power module of the present embodiment.

DETAILED DESCRIPTION OF THE PREFERRED EMBODIMENTS

Preferred embodiments of the present invention will be described hereinafter, based on the drawings.

Figure 1:
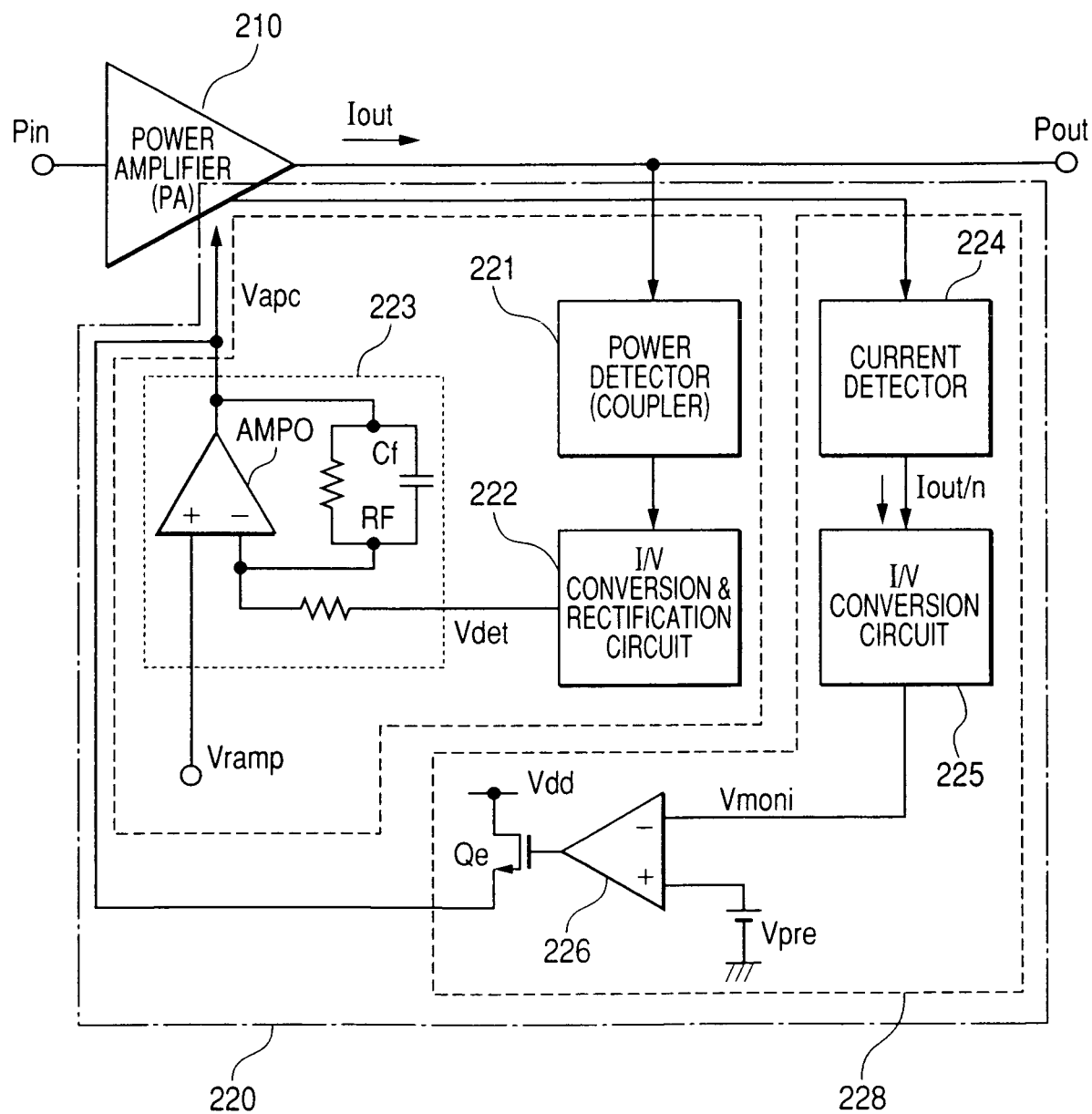
FIG. 1 is a block diagram showing an outlined configuration of an embodiment of an output power control circuit having a function of precharging a high frequency power amplifier circuit, according to the present invention.

FIG. 1 shows an outlined configuration of an embodiment of an output power control circuit having a function of precharging a high frequency power amplifier circuit, according to the present invention. In FIG. 1, reference numeral 210 denotes a high frequency power amplifier circuit configured with transistors such as Field Effect Transistors (FETs) as amplifying elements. The power amplifier circuit includes a bias control circuit which generates a bias voltage which is applied to a gate or base terminal of each amplifying transistor to allow an idle current to flow, according to a desired output power. The high frequency power amplifier circuit 210 is generally comprised of three stages of amplifiers, but may be comprised of one stage or two stages of amplifiers.

The bias control circuit provided in the high frequency power amplifier circuit 210 may be configured as a circuit consisting of resistance voltage dividers, each of which receives an output power control voltage Vapc and divides this voltage at a suitable ratio, thus generating a bias voltage to each stage of an amplifying transistor. Alternatively, it may be configured as a current mirror type bias circuit which includes transistors for bias, each of which is connected to each stage of an amplifying transistor to form a current mirror. The current mirror type bias circuit applies a bias to each amplifying transistor by converting the output power control voltage Vapc into a bias current at a suitable ratio and allowing the bias current to flow through each transistor for bias.

Reference numeral 220 denotes an output power control circuit which detects output power of the high frequency power amplifier circuit 210 and generates and applies the output power control voltage Vapc to the high frequency power amplifier circuit 210. The output power control circuit includes a power detecting circuit 221 which detects the amplifier output power by a coupler or the like and outputs a current that is proportional to the detected output power, a current-to-voltage conversion circuit 222 which converts the output current from the detector into a voltage, and an error amplifier 223 which compares a detected voltage Vdet as a result of the conversion with an output level directive signal Vramp supplied from a baseband circuit and outputs a voltage corresponding to a potential difference between Vdet and Vramp as the output power control voltage Vapc. Such a circuit comprised of the output power detecting circuit 221, the current-voltage conversion circuit, and the error amplifier 223 is a relatively common circuit that has been used traditionally as an APC circuit.

In the output power control circuit 220 of the present embodiment, a precharge circuit 228 is provided in addition to the above circuits 221 to 223. The precharge circuit 228 is comprised of a current detecting circuit 224 which detects a current flowing through a final-stage amplifying transistor in the high frequency power amplifier circuit 210, a current-to-voltage conversion circuit 225 which converts the thus detected output current into a voltage, a differential amplifier which compares the voltage Vmoni as a result of the conversion with a predetermined reference voltage Vpre, and a transistor Qe whose gate terminal receives an output voltage of the differential amplifier 223 and whose source terminal is connected to an output terminal of the error amplifier 223, allowing a current corresponding to a potential difference between Vmoni and Vpre into the error amplifier 223. As the transistor Qe, a MOSFET is employed in this embodiment; instead, a bipolar transistor may be employed.

The precharge circuit 228 turns the transistor Qe on, allowing the current to flow into the error amplifier 223, when the voltage Vmoni input to the differential amplifier 226 is lower than the reference voltage Vpre. Here, the reference voltage Vpre is set at a level equivalent to −30 dBm to −20 dBm of output power. Preferably, the reference voltage Vpre is generated by a constant voltage circuit like a band gap reference circuit capable of generating a constant voltage not dependent on supply voltage and temperature. The precharge circuit 228 of this embodiment is arranged such that the transistor Qe is automatically turned off at the rise of the output level directive signal Vramp, when the output of the error amplifier 223 rises higher than the precharge level given by the precharge circuit 228 and the source voltage of the transistor Qe becomes higher than its gate voltage.

Figure 2A:
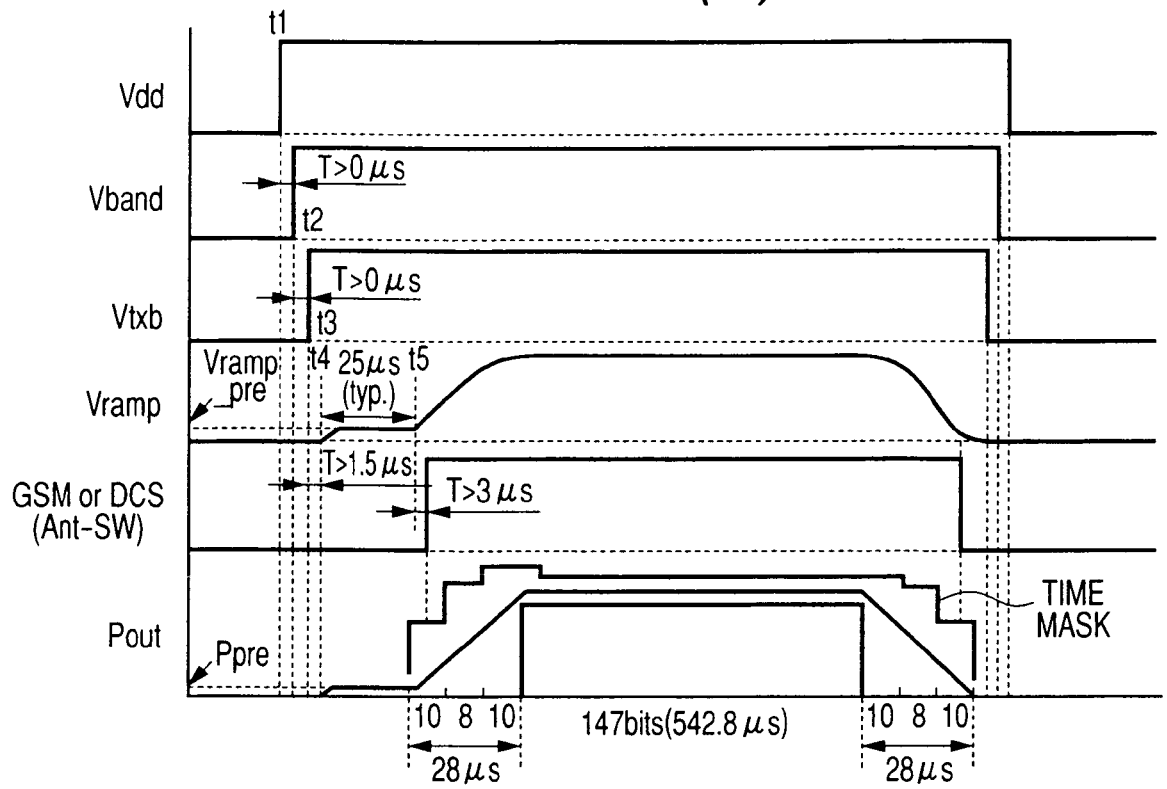
Figure 2B:
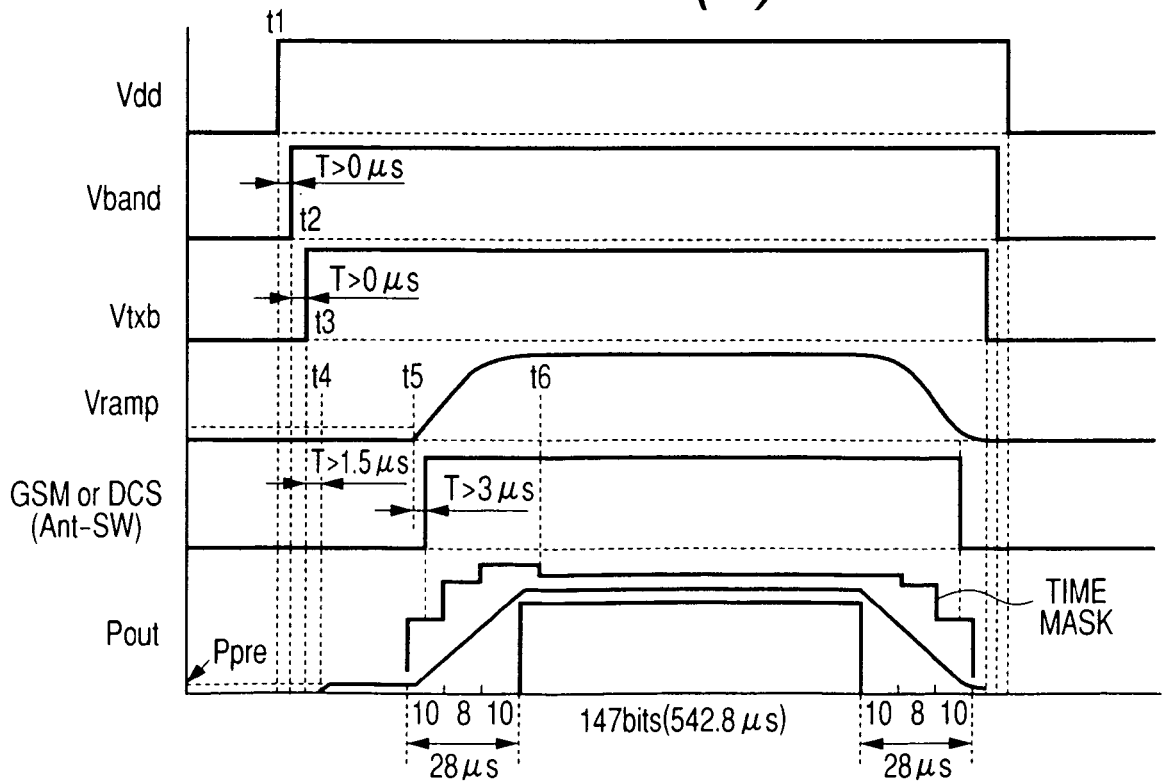

FIG. 2(B) shows how the potentials of internal nodes of a module for high frequency power amplification (hereinafter referred to as a power module) to which the above embodiment is applied change when transmission starts.

Figure 11A:
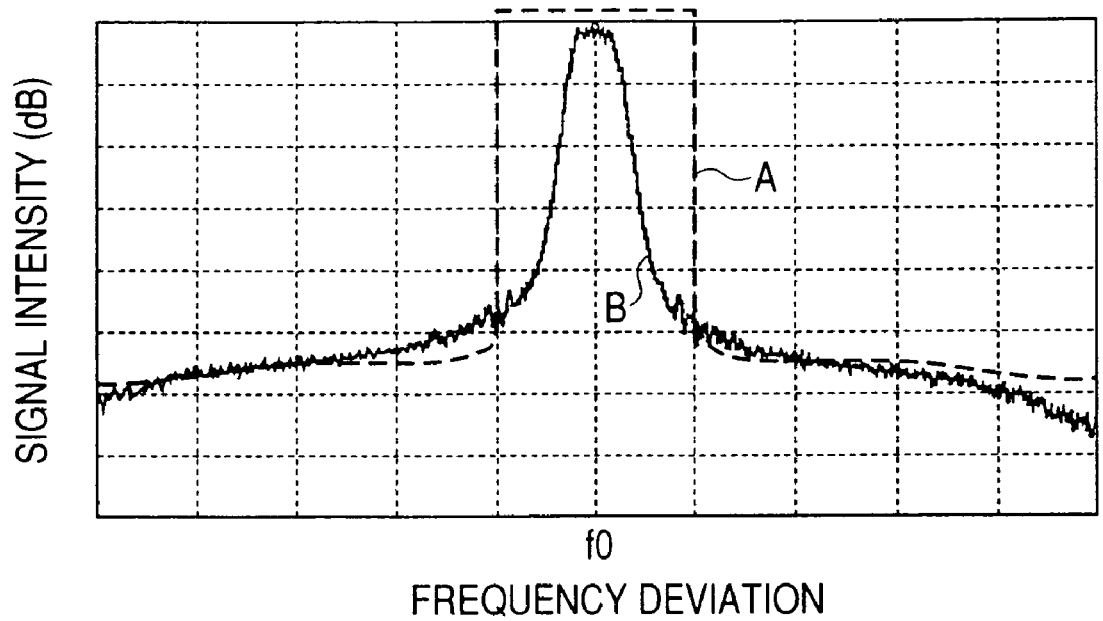
Figure 11B:
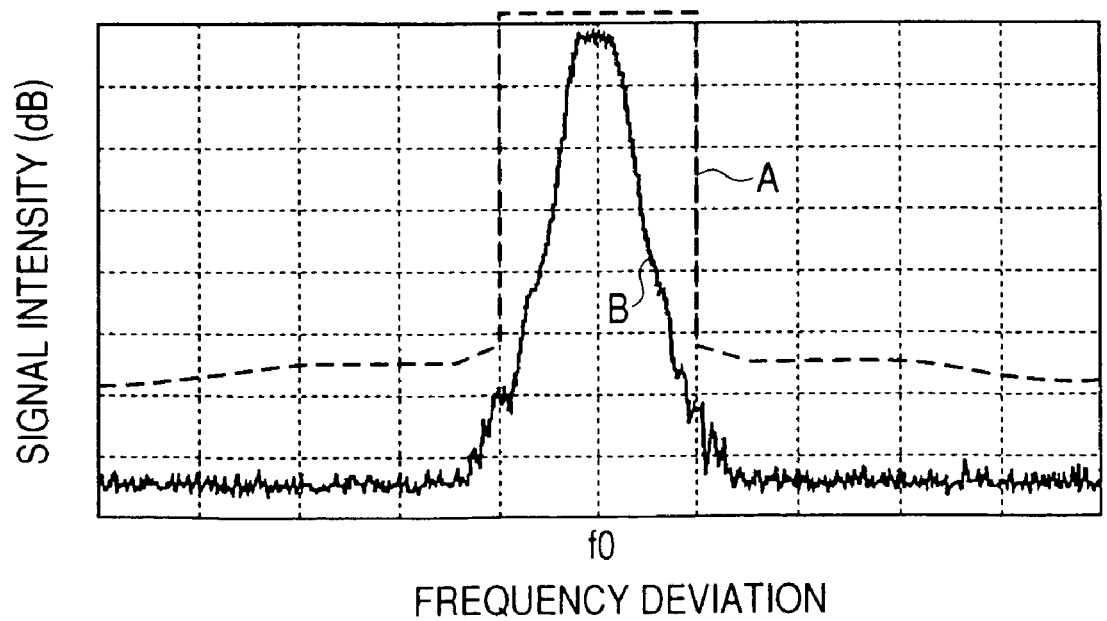

As apparent by comparison with the changes of the potentials in the conventional method of precharge by a software process, shown in FIG. 2(A), it is seen that the following result is obtained by applying the present embodiment. Output power Pout rises without raising the output level directive signal Vramp for precharging for a period of t4 to t5 and its rise can fall within a predefined time mask prescribed by the GSM standards for a period of t5 to t6. We observed the spectrum characteristic of an output signal of the power module to which the present embodiment is applied by simulation and obtained an output signal profile plotted by a solid line B in FIG. 11(B). From this, it was seen that the signal profile can be kept lower than the allowable range (plotted by a dashed line A) of signal strength prescribed by the GSM standards. In FIG. 11, f0 is a center transmitting frequency.

The high frequency power amplifier circuit 210 and the output power control circuit 220 shown in FIG. 1 are implemented by being assembled in a module constructed by one or more semiconductor chips (ICs) and external elements such as capacitors. In this specification, a module refers to a structure in which a plurality of semiconductor chips and discrete components are mounted on an insulating substrate such as a ceramic substrate with printed wiring formed in its inside and on the surface. The structure in which all components are interconnected by the printed wiring and bonding wires to fulfill their specific roles is handled as a single electronic part.

Figure 3:
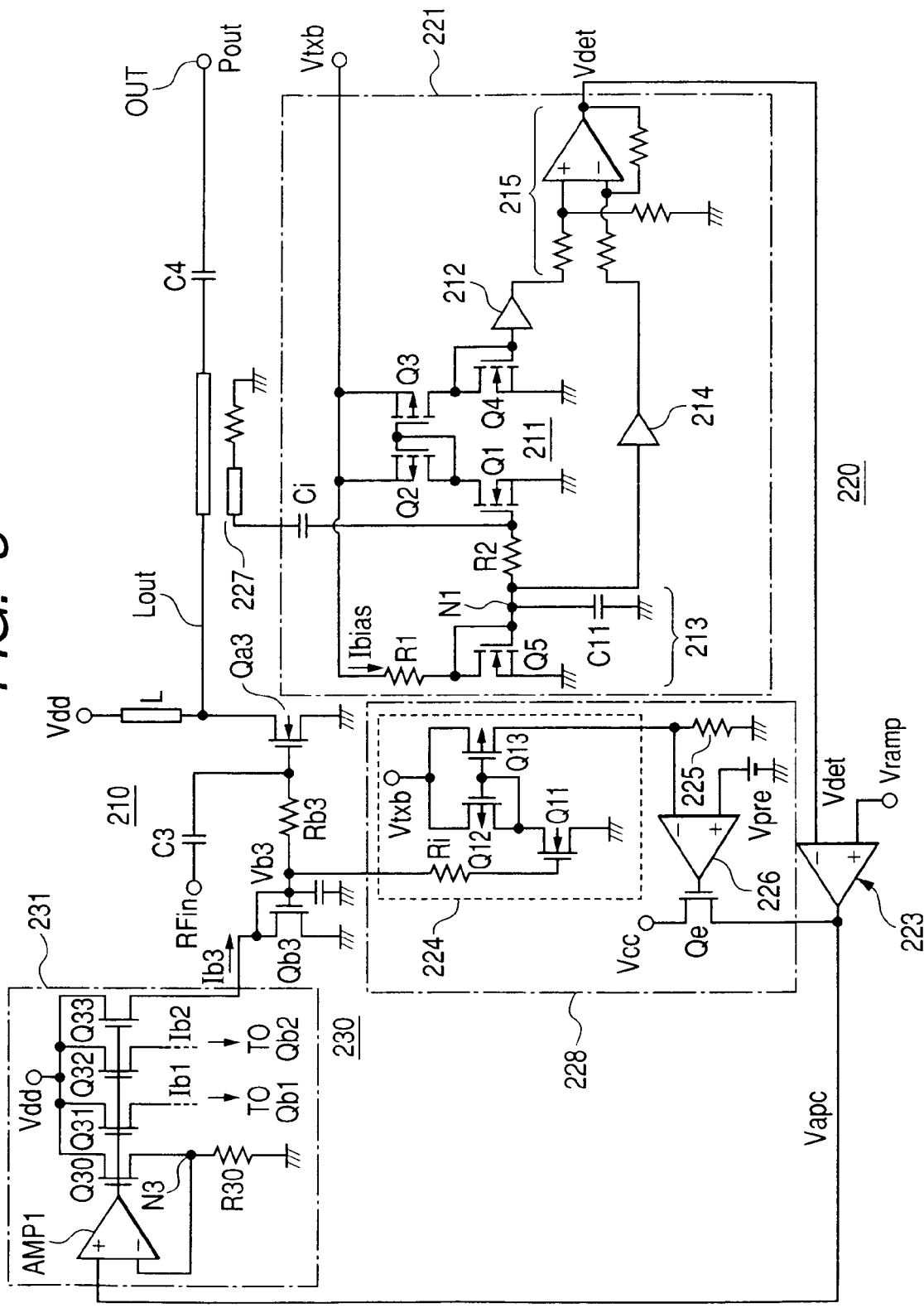
FIG. 3 is a circuit diagram showing a concrete example of circuitry of the output power control circuit 220.

FIG. 3 shows a concrete example of circuitry of the output power control circuit 220. Here, this circuitry will be explained by taking an example where the high frequency power amplifier circuit 210 is comprised of, but not limited to, three amplifying transistors cascaded in multiple stages, which are not shown. In FIG. 3, Qa3 denotes the final-stage amplifying transistor in the high frequency power amplifier circuit 210. After amplified by the preceding-stage amplifying transistor, an RF signal RFin is input via a capacitor C3 for cutting a DC component to a gate terminal of the transistor Qa3 and a drain terminal of the transistor Qa3 is connected to an output terminal OUT through an output line Lout. On the output line Lout, a capacitor C4 for cutting a DC component and a micro-coupler 227 which will be described later are installed.

A transistor Qb3 for bias is connected via a resistor Rb3 to the gate terminal of the amplifying transistor Qa3, so that the transistors Qb3 and Qa3 form a current mirror; however, this is not so limited. A bias current Ib3 from a current generating circuit 231 flows into this transistor Qb3, causing a drain current as an idle current to flow through the transistor Qa3, wherein the drain current is proportional to a size ratio between the transistors Qb3 and Qa3. Likewise, transistors (Qb1, Qb2) for bias are respectively connected to amplifying transistors in previous stages to form current mirrors and bias currents Ib1, Ib2 from the current generating circuit 231 are allowed to flow into these transistors. A gate bias control circuit 230 is formed by the current generating circuit 231 and the transistors for bias Qb1, Qb2, and Qb3.

The current detecting circuit 224 is comprised of an N-channel MOSFET Q11 for current detection, a P-channel MOSFET Q12 connected in series to the transistor Q11, and a MOSFET Q13 which forms a current mirror with the transistor Q12. A voltage equivalent to a bias voltage Vb3 that is applied to the gate terminal of the final-stage amplifying transistor Qa3 is applied via resistor Ri to the gate terminal of the MOSFET Q11. A drain current of the transistor Q13 is allowed to flow through a resistor 225 which functions as a current-to-voltage conversion means.

In the present embodiment, the amplifying transistor Qa3 is formed by a Laterally Diffused MOSFET (LDMOS) having a relatively high source-drain withstand voltage (about 20V), wherein the electrode is diffused laterally on the semiconductor chip. Accordingly, the transistor Qb3 for bias and the transistor Q11 for current detection are formed by smaller LDMOSs. In consequence, a current that is proportional to the drain current of the amplifying transistor Qa3 flows through the transistor Q11 for current detection and, as a result, an output current can be detected. By using the gate voltage of the amplifying transistor Qa3 to detect the current, the current detecting circuit 224 of this embodiment can be made highly sensitive even to a low power current. Since the transistor Q11 for current detection is formed by using an element formed on the same semiconductor chip on which the amplifying transistor Qa3 is formed, detected current variation due to manufacture variance can be reduced.

The output power detecting circuit 221 is comprised of a detector section 211 consisting of a capacitor Ci, one end of which is connected to the micro-coupler 227 installed on the output line Lout between the drain terminal of the final-stage amplifying transistor Qa3 and the output terminal OUT, an N-channel MOSFET Q1, to the gate of which the other terminal of the capacitor Ci is connected, a P-channel MOSFET Q2 connected in series to the transistor Q1, a MOSFET Q3 which forms a current mirror with the transistor Q2, and a MOSFET Q4 for current-to-voltage conversion connected in series to the transistor Q3, a buffer circuit 212 which performs an impedance transformation of a voltage as a result of the conversion by the transistor Q4 and supplies a resultant voltage to the next stage, a bias generating circuit 213 which applies a gate bias voltage to the MOSFET Q1, a buffer circuit 214 which performs an impedance transformation of a bias voltage generated by the bias generating circuit 213 and supplies a resultant voltage to the next stage, a subtraction circuit 215 which subtracts the output of the buffer circuit 214 from the output of the buffer circuit 212 and outputs a resultant voltage. As the buffer circuits 212 and 214, voltage followers can be used.

The bias generating circuit 213 is comprised of a resistor R1 and a MOSFET Q5 connected in series between a supply voltage terminal to which a constant voltage Vtxb is applied externally and a ground point, a resistor R2 connected between the gate terminal of the MOSFET Q5 and the gate terminal of the MOSFET Q1 for output detection, and a capacitor C11 connected between the gate terminal of the MOSFET Q5 and a ground point. The MOSFET Q5 whose gate and drain terminals are coupled is configured to work as a diode. By current Ibias flowing through the resistor R1 and the transistor Q5, the potential of a node N1 is determined. The potential of the node N1 is applied to the gate terminal of the MOSFET Q1 for output detection as a bias voltage that gives an operating point.

In the present embodiment, a voltage value in the vicinity of a threshold voltage of the MOSFET Q1 is set as the bias voltage value so that the MOSFET Q1 for output detection can perform class B amplification. In consequence, a current like that produced by half-wave rectification of an input current, proportional to the AC waveform of the input current to the MOSFET Q1 via the capacitor Ci flows through the MOSFET Q1. The drain current of the MOSFET Q1 includes a DC component proportional to the amplitude of the input AC signal.

The drain current Id of this transistor Q1 is mirrored to the transistor Q3 through the current mirror circuit of Q2 and Q3 and converted into a voltage by the diode-connected transistor Q4. Here, a pair of the MOSFETs Q1 and Q4 and a pair of the MOSFETs Q2 and Q3 are respectively set to have a predetermined size ratio between the two. Therefore, when, for example, the characteristics (particularly, threshold voltages) of the MOSFETS Q1 and Q2 vary due to manufacture variance, the characteristics of the mating MOSFETs Q4 and Q3 vary correspondingly. As a result, the effects of the characteristic variations cancel each other and a voltage corresponding to the detected output, not affected by variance in the MOSFETS, appears at the drain terminal of the MOSFET Q4.

In the present embodiment, the potential of the node N1 connecting the gate terminal of the MOSFET Q5 and the resistor R2 in the bias generating circuit 213 is input to the input terminal of the buffer circuit 214. The resistor R2 and the capacitor C11 work as a low-pass filter to prevent an AC component of output power drawn in via the capacitor Ci from being fed to the input of the buffer circuit 214.

In the present embodiment, the same voltage as the bias voltage that is generated by the bias generating circuit 213 and applied to the gate terminal of the MOSFET Q1 for output detection is supplied via the buffer circuit 214 to the subtraction circuit 215. The voltage corresponding to the detected output, from which the bias voltage has been subtracted, is output from the subtraction circuit 215. Consequently, the output of the subtraction circuit 215, as the detected voltage Vdet that is proportional to the net AC component of output power, not including the DC component added by the bias generating circuit 213, is input to the error amplifier 223. The error amplifier 223 outputs a voltage corresponding to a potential difference between the detected voltage Vdet and the output level directive signal Vramp, as the output power control voltage Vapc, to the current generating circuit 231.

The current generating circuit 231 is comprised of a differential amplifier AMP1 which receives the output power control voltage Vapc at its noninverting input terminal, a MOSFET Q30 which receives an output of the differential amplifier AMP1 at its gate terminal, a resistor R30 connected in series to the MOSFET Q30, and MOSFETs Q31, Q32, and Q33 which receive the same gate voltage as that of the MOSFET Q30. By feeding back the potential of a node N3 connecting the MOSFET Q30 and the resistor R30 to an inverting input terminal of the differential amplifier AMP1, the MOSFET Q30 is driven so that the potential of the connecting node N3 will match Vapc and currents that are proportional to the output power control voltage Vapc flow through the MOSFETs Q31, Q32, and Q33.

These currents flow into the transistors for bias Qb1, Qb2, and Qb3, which respectively form current mirrors with the amplifying elements Qa1, Qa2, and Qa3, as bias currents Ib1, Ib2, and Ib3. By setting proper size ratios of the transistors Q31, Q32, and Q33, respectively, to the transistor Q30 beforehand, desired amounts of bias currents, proportional to Vapc, can be allowed to flow into the transistors for bias Qb1, Qb2, and Qb3, respectively. Usually, the bias currents are set as follows: $Ib1 < Ib2 < Ib3$. The current generating circuit 231 of FIG. 3 is an example and its embodiment is not so limited. A limiter may be attached to the noninverting input terminal of the differential amplifier AMP1 to limit the input to a maximum level and below. The circuit may be configured such that resistance voltage dividing circuits are installed, instead of the current generating circuit 231 and the transistors Qb1, Qb2, and Qb3, and bias voltages produced by dividing Vapc at proper resistance ratios are applied to the gate terminals of the amplifying elements Qa1, Qa2, and Qa3.

Figure 4:
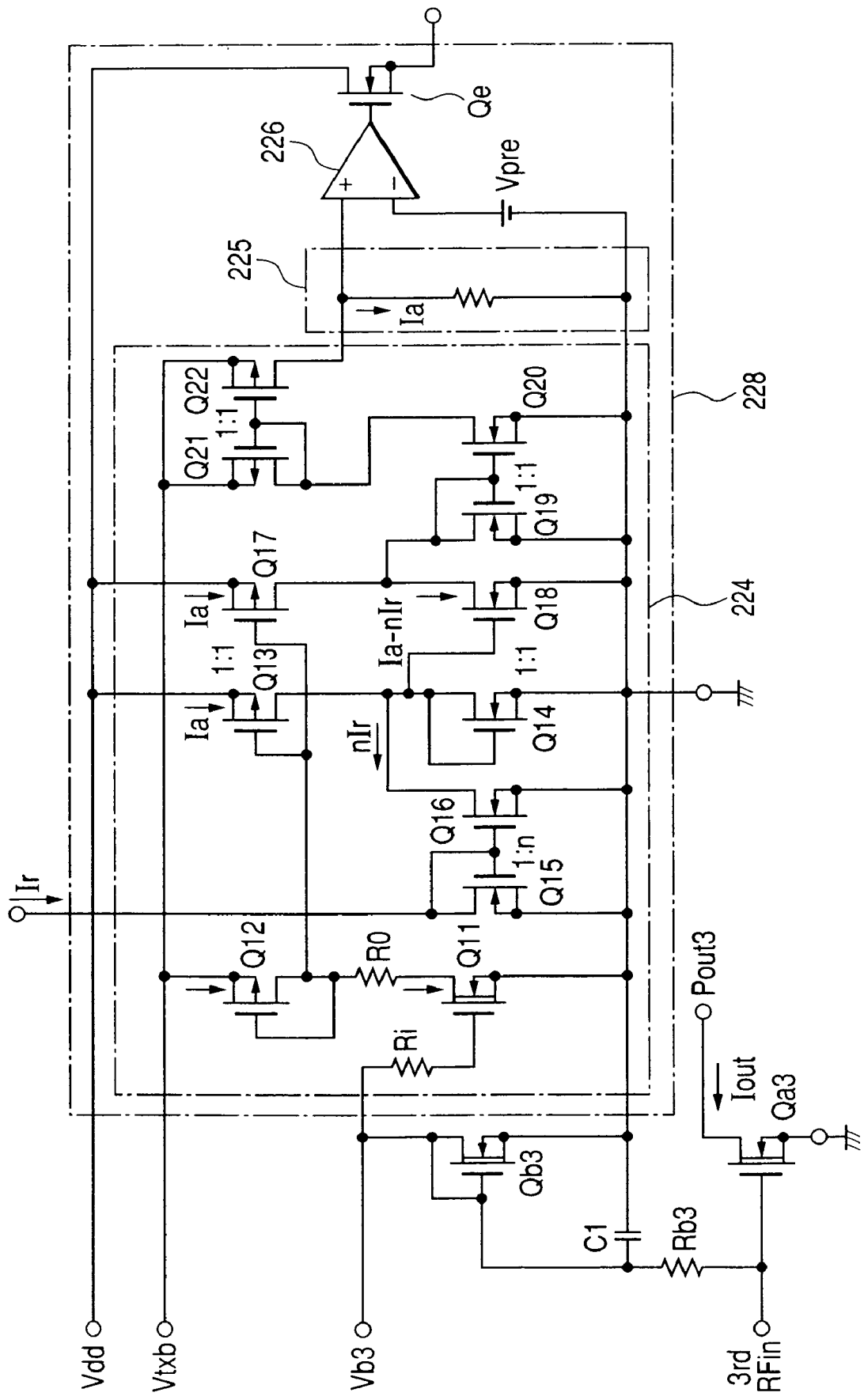
FIG. 4 is a circuit diagram showing a more preferred example of a precharge circuit.

FIG. 4 shows a more preferred example of the precharge circuit 228. In FIG. 4, elements corresponding to those shown in the circuitry of FIG. 3 are assigned the same reference numerals and symbols and their redundant explanation is not repeated.

The precharged circuit 228 of this embodiment includes a current clamp circuit provided in the current detecting circuit 224. Specifically, a MOSFET Q12 for a current mirror is connected via a resistor R0 to the drain of the MOSFET Q11 for current detection to improve the sensitivity by suppressing the drain voltage of the MOSFET Q11 and by applying a bias near the bias state of the final-stage amplifying transistor Qa3. A diode-connected MOSFET Q14 is connected in series between the drain of a transistor Q13 which forms a current mirror with the transistor Q12 and a ground point.

A MOSFET Q16 is connected in parallel with this transistor Q14. The MOSFET Q16 forms a current mirror with a diode-connected MOSFET Q15 through which a predetermined current Ir which is externally supplied flows and bypasses a part of a current from the transistor Q13. A transistor Q17 whose gate receives the same voltage as the voltage applied to the transistor Q13 is installed. A transistor Q18 is connected in series to the transistor Q17 and its gate receives the same voltage as the voltage applied to the transistor Q14. A diode-connected transistor Q19 is installed in parallel with the transistor Q18. A transistor Q20 which forms a current mirror with the transistor Q19 and transistors Q21 and Q22 which form a current mirror to loop back a current flowing through the transistor Q20 are installed. A resistor 225 is connected in series to the transistor Q22.

A size ratio between the transistors Q15 and Q16 (ratio in terms of gate width W and gate length L) is 1:n, the transistors Q13 and 17 are equal in size, the transistors Q14 and Q18 are equal in size, the transistors Q19 and Q20 are equal in size, and the transistors Q21 and Q22 are equal in size. Consequently, in the current detecting circuit 224 of this embodiment, current n·Ir that is n times as much as current Ir flowing through the transistor Q15 flows through the transistor Q16 and current (Ia−n·Ir) obtained by subtracting the current n·Ir flowing through the transistor Q16 from current Ia flowing through the transistor Q13 flows through the transistors Q14 and Q18. As a result, if Ia>n·Ir, current n·Ir obtained by subtracting the current (Ia−n·Ir) flowing through the transistor Q17 from the current Ia flowing through the transistor Q17 flows through the transistors Q19 to Q22 and an output current is clamped to n·Ir. Otherwise, if Ia<n·Ir, all the current flowing through the transistor Q13 flows through the transistor Q16, no current "0" flows through the transistors Q14 and Q18, and all the current Ia flowing through the transistor Q17 flows through the transistor Q19. By the current mirrors of the transistors Q19 to Q22, the current flowing through the transistor Q19 is copied as is and, eventually, the current Ia flows through the resistor 225 for current-to-voltage conversion.

Here, consider the operation of the precharge circuit 228 at start of transmission. Initially, supply voltage Vtxb to the precharge circuit 228 rises with both Vramp and Vb3 being "0." At this time, because Vapc is "0", the transistors Q11 to Q13 are turned off so that less or no current flows through the Q11 and Q13 and the final-stage transistor Q22 is turned off so that less or no current flows through the Q22 as well in the current detecting circuit 224. Therefore, the voltage at the inverting input terminal of the differential amplifier 226 is substantially 0V and lower than the voltage Vpre at the non-inverting input terminal. Consequently, the transistor Qe is turned on, Vapc rises, and precharging begins.

Then, when Vb3 rises, current becomes to flow through the transistors Q11 to Q13 in the current detecting circuit 224 and current flows through the transistors Q14 to Q22 as well in the clamp circuit. With an increase in the voltage at the inverting input terminal of the differential amplifier 226, this amplifier output decreases, which causes a negative feedback to the transistor Qe. At this time, even if Vapc rapidly rises and a large current flows through the transistors Q11 to Q13 in the current detecting circuit, the current flowing through the transistor Q17 is clamped to n·Ir. Thus, it is possible to avoid an unstable operation in which an excessive current flow inverts the output of the differential amplifier 226, which turns the transistor Qe off and stops precharging.

Figure 5:
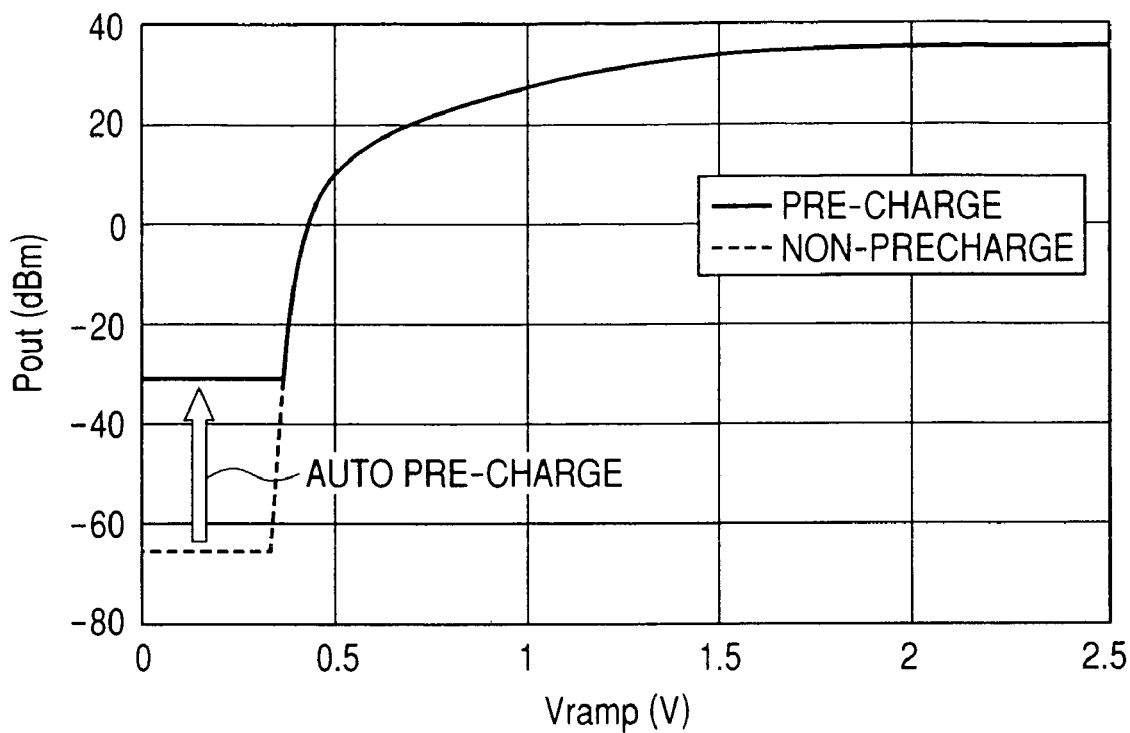
FIG. 5 a graph of output level directive signal Vramp versus output power Pout for the high frequency power amplifier circuit to which the precharge circuit of the present embodiment is applied and a conventional high frequency power amplifier circuit without the precharge circuit.

FIGS. 5 through 8 show results of examining a relation between the output level directive signal Vramp and output power Pout by simulation for the high frequency power amplifier circuit to which the precharge circuit 228 of the present embodiment is applied. In FIG. 5, a solid line A plots the characteristic of the circuit to which the present invention is applied and a dashed line B plots the characteristic of the circuit to which the present embodiment is not applied. From FIG. 5, it is apparent that about 35 dBm higher output power Pout in the range of 0 to 0.35 V of the output level directive signal Vramp can be achieved by applying the present embodiment.

Figure 6:
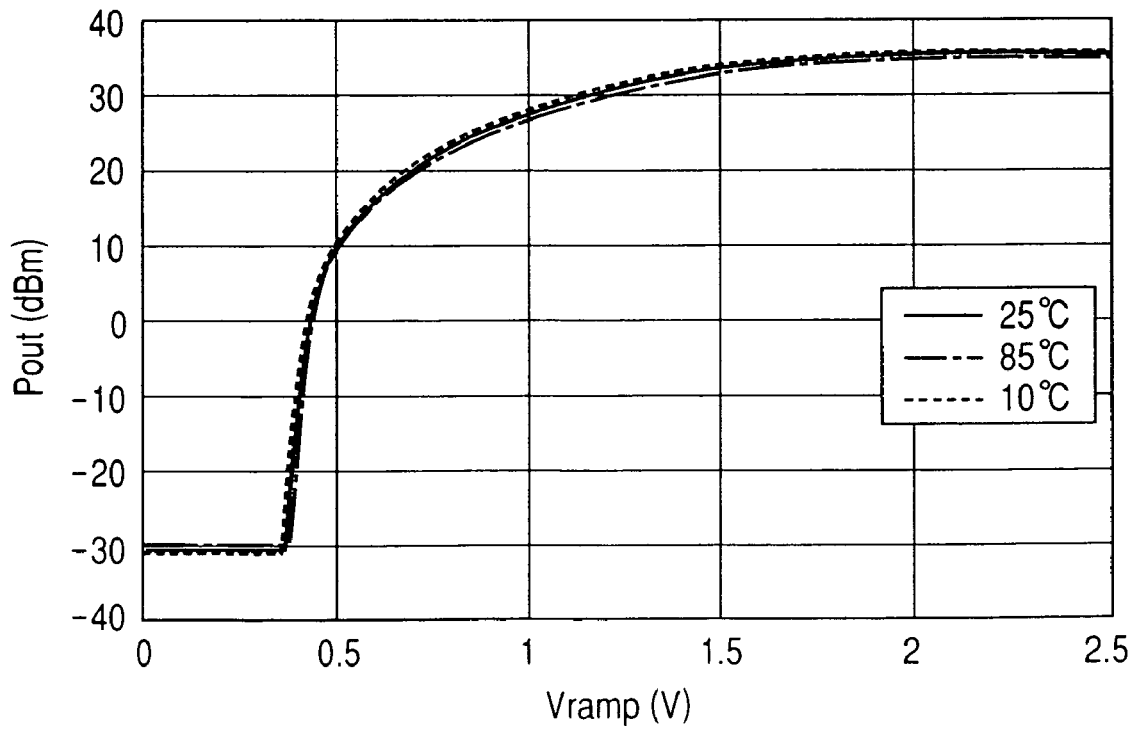
FIG. 6 is a graph of output level directive signal Vramp versus output power Pout at varied temperatures for the high frequency power amplifier circuit to which the precharge circuit of the present embodiment is applied.
Figure 7:
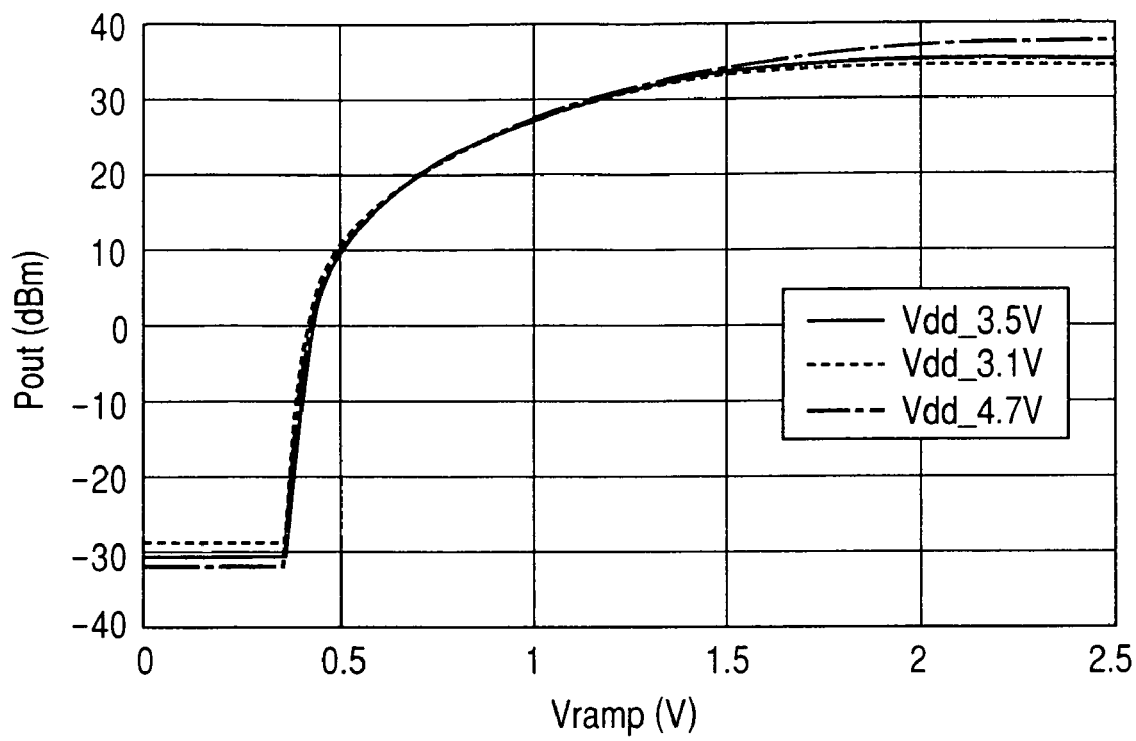
FIG. 7 is a graph of output level directive signal Vramp versus output power Pout with varied supply voltages for the high frequency power amplifier circuit to which the precharge circuit of the present embodiment is applied.
Figure 8:
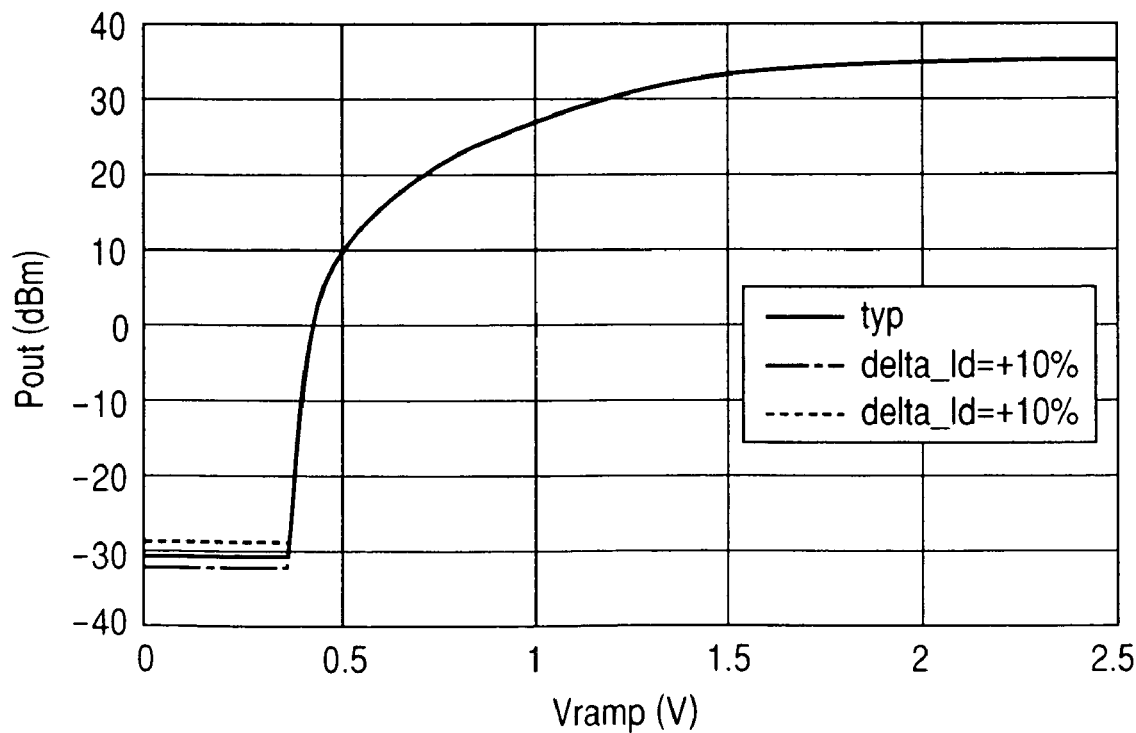
FIG. 8 is a graph of output level directive signal Vramp versus output power Pout at varied precharge levels assumed to occur by manufacture variance for the high frequency power amplifier circuit to which the precharge circuit of the present embodiment is applied.

FIG. 6 shows change in the output power Pout characteristic, as Vramp increases, at varied temperatures. FIG. 7 shows change in the output power Pout characteristic, as Vramp increases, with varied supply voltages Vdd. FIG. 8 shows change in the output power Pout characteristic, as Vramp increases, at varied precharge levels which are assumed to occur if a ratio between the current flowing through the transistor Q11 for current detection and the current flowing through another transistor such as Q13 differs from a design value due to manufacture variance. Assuming that a target precharge level of output power Pout is −30 dBm (initially), which increases by 64 dBm by precharge, we checked for deviation from the target in the worst cases where the all variances by the above factors are greatest. We can make sure that observed values deviated from the target level are +4.5 dm at maximum and −3.2 dBm at minimum and such deviations well falls within design tolerances.

Figure 9:
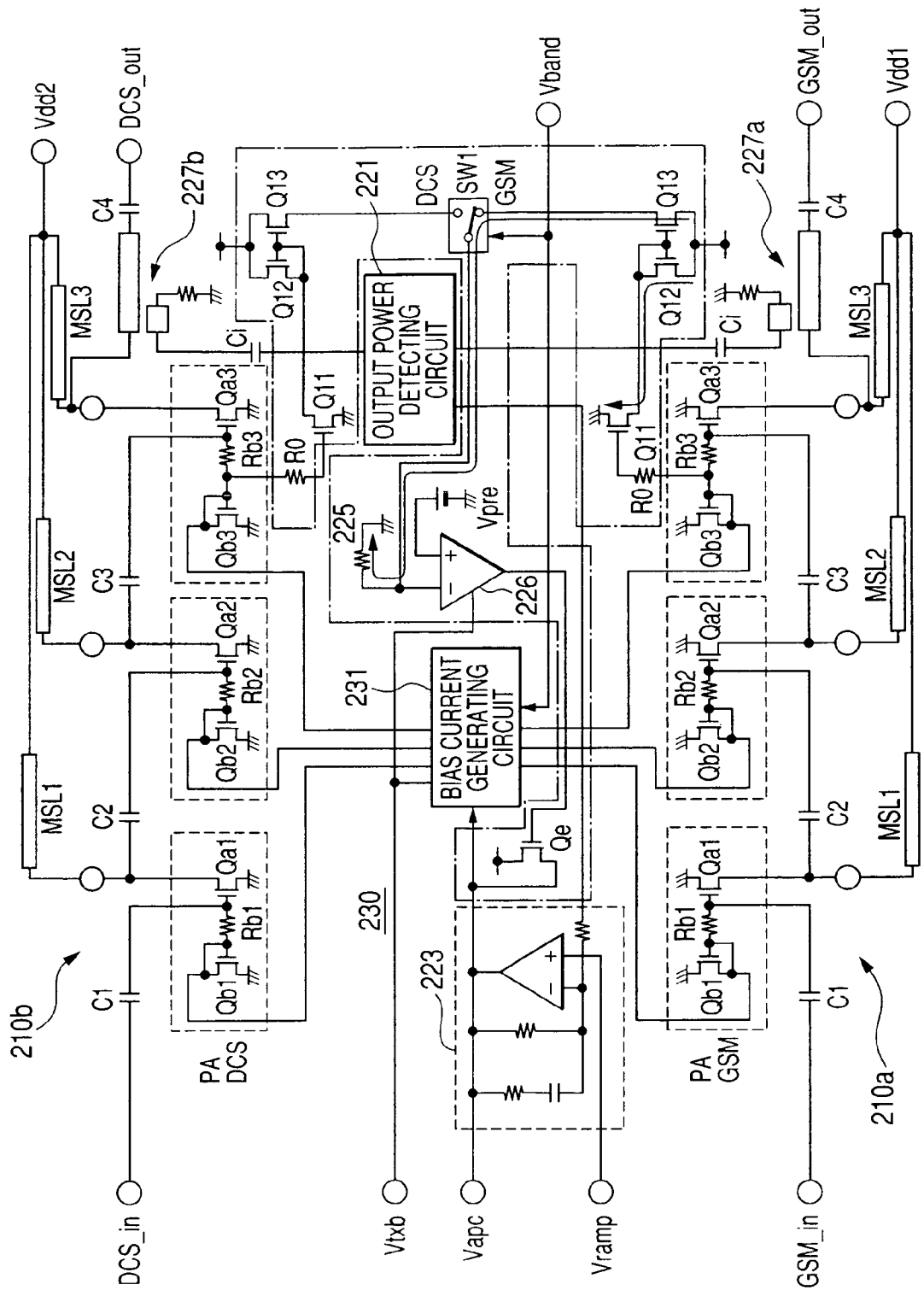
FIG. 9 is a block diagram showing another embodiment of the power module to which the output power control circuit including the precharge circuit of the above embodiment is applied.

FIG. 9 shows another embodiment of the power module to which the output power control circuit 220 including the precharge circuit 228 of the above embodiment is applied. This embodiment is configured to make it possible to amplify output power and output transmit signals adaptively to either of two modes of GSM and DCS (Digital Cellular System). The power module 200 includes a high frequency power amplifier circuit for GSM 210a and a high frequency power amplifier circuit for DCS 210b and the output power control circuit 220 is provided as a common circuit for the amplifier circuits for GSM and DCS except the current detecting circuit 224 for precharging.

Specifically, a resistor 225 as the current-to-voltage conversion means, a differential amplifier 226, and an emitter follower type transistor Qe, which are components of the precharge circuit 228, are provided as common circuits for the power amplifier circuits for GSM and DCS. The resistor 225 is equipped with a changeover switch SW1 switching a connection between output current from a current detection circuit for GSM and output current from a current detecting circuit for DCS. Changeover of this switch and the current generating circuit 231 are controlled by a band control signal Vband indicating whether GSM or DCS transmit signals comes from the baseband circuit. While FIG. 9 shows the power module to which the precharge circuit 228 of the first embodiment shown in FIG. 3 is applied for convenience of graphical representation, it is needless to say that the precharge circuit 228 of the second embodiment shown in FIG. 4 can be applied.

Each of the high frequency power amplifier circuit for GSM 210a and the high frequency power amplifier circuit for DCS 210b is configured such that three amplifying transistors Qa1, Qa2, and Qa3 are cascaded, that is, each consists of three amplifier circuits connected in a such a way that a drain voltage of the preceding-stage transistor is input to a gate terminal of the following-stage transistor. Inductors MSL1, MSL2, and MSL3 consisting of microstrip lines formed on the module substrate are respectively connected between each amplification stage of the amplifying transistors Qa1, Qa2, and Qa3 and either of supply voltage terminals Vdd1, Vdd2.

Capacitors C1, C2, and C3 to cut off DC components of RF signals to be amplified are provided between each amplification stage. Transistors for bias Qb1, Qb2, and Qb3, the gate terminal of each is connected via a resistor to the gate terminal of the corresponding one of the amplifying transistors Qa1, Qa2, and Qa3, are provided in each amplification stage. As bias currents Ib1, Ib2, and Ib3 from the current generating circuit 231 in the output power control circuit flow through these transistors Qb1, Qb2, and Qb3, the corresponding bias voltages are applied to the amplifying transistors Qa1, Qa2, and Qa3, allowing operating currents in accordance with the power control voltage Vapc to flow through these transistors.

Figure 10:
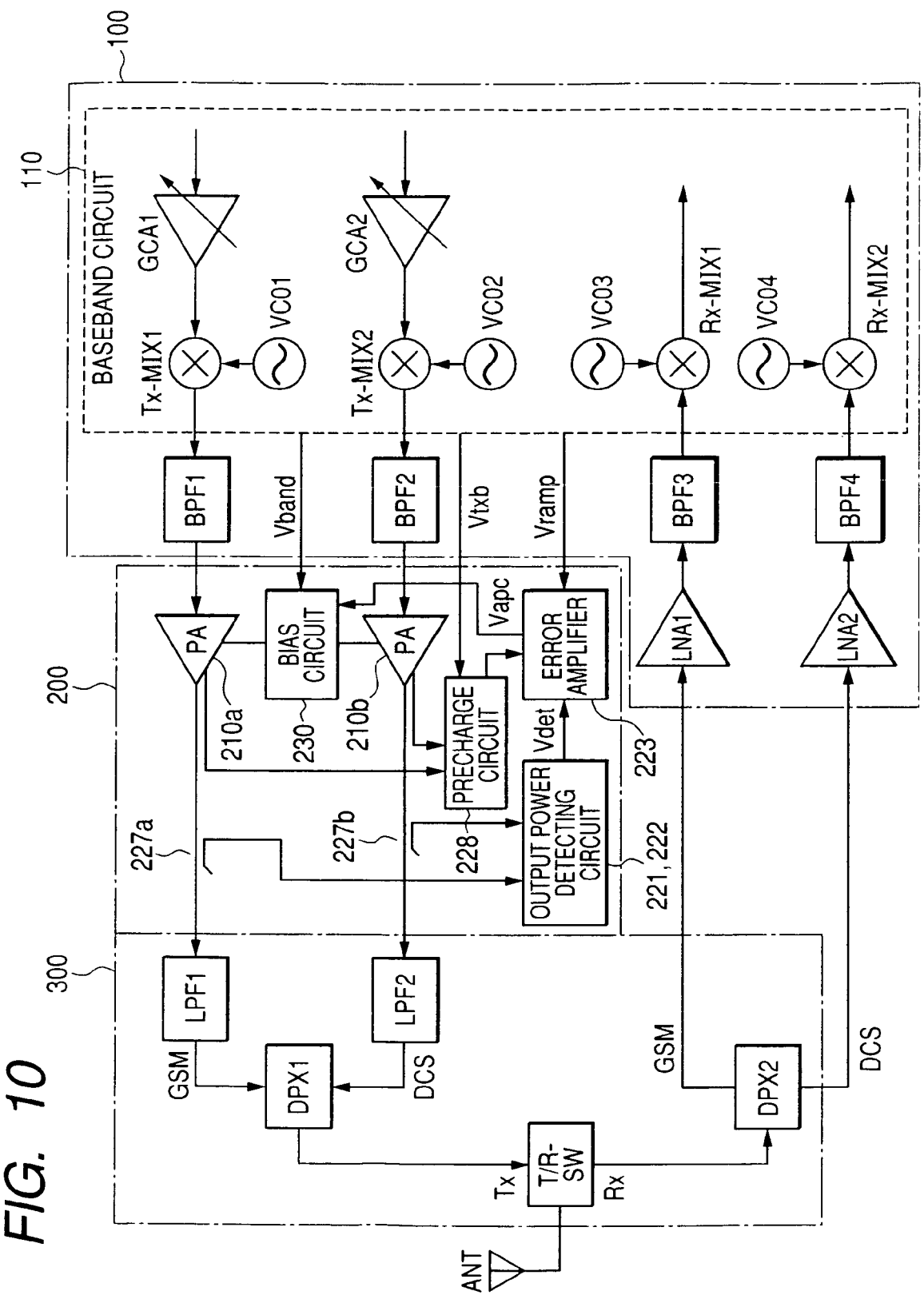
FIG. 10 is a block diagram showing an outlined configuration of a wireless communication system to which the high frequency power amplifier circuit including the output power control circuit having the precharge function of the above embodiment is applied.

FIG. 10 shows an outlined configuration of an example of wireless communication system employing the module for high frequency power amplification according to the embodiment of FIG. 9.

In FIG. 10, ANT denotes an antenna for transmitting and receiving radio signal carriers and reference numeral 100 denotes an electronic device (hereinafter referred to as an RF device), in a single package of which the following components are installed: a semiconductor integrated, RF signal processing circuit (hereinafter referred to as an baseband IC) including modulation/demodulation circuits capable of GMSK modulation/demodulation for GSM and DCS systems and EDGE mode PSK modulation/demodulation and circuits for resolving transmit data (baseband signals) into I and Q components and processing I and Q components extracted from received signals, low noise amplifiers LNA1, LNA2 to amplify received signals, bandpass filter BPF1, BPF2 to eliminate harmonic components from transmit signals, bandpass filters BPF3, BPF4 to eliminate spurious components from received signals, etc. The low noise amplifiers LNA1, LNA2 can be built into the baseband IC 110.

The baseband IC 110 includes mixers Tx-MIX1, Tx-MIX2 which up-convert GSM and DCS transmit signals, respectively, mixers Rx-MIX1, Rx-MIX2 which down-convert GSM and DCS received signals, respectively, oscillators VCO1 to VCO4 which generate oscillation signals to be mixed with transmit singles and received signals by these mixers, and gain control amplifiers GCA1, GCA2 to amplify GSM and DSC transmit signals, respectively.

In FIG. 10, reference numeral 200 denotes the power module of the foregoing embodiment including the high frequency power amplifier circuit to amplify RF transmit signals supplied from the baseband IC 110 and the output power control circuit. Reference numeral 300 denotes a front-end module including filters LPF1, LPF2 to eliminate noise such as higher harmonics included in transmit signals, duplexers DPX1, DPX2 for combining and separating GSM signals and DCS signals, and a transmit/receive changeover switch T/R-SW, etc.

As shown in FIG. 10, in this embodiment, a mode control signal Vband indicating either GSM or DCS, an output level directive signal Vramp, a supply voltage Vtxb for the detecting circuit are supplied from the baseband IC 110 to the power module 200. Based on the control signal Vband and the output level directive signal Vramp, the output power control circuit generates and supplies bias currents to either high frequency power amplifier circuit 210a or 210b, while the precharge circuit 228 is triggered by rise of the supply voltage Vtxb and carries out precharging in accordance with the output power control voltage Vapc.

While the invention made by the present inventors has been described specifically, based on its embodiments, it will be appreciated that the present invention is not limited to the embodiments described hereinbefore and various changes may be made without departing from the scope of the invention. For instance, although FETs are used as amplifying transistors Qa1 to Qa3 in the high frequency power amplifier circuit in the foregoing embodiments, bipolar transistors, GaAs MESFETs, Heterojunction Bipolar Transistors (HBTs), High Electron Mobility Transistors (HEMTs), and other transistors can be used instead.

While, in the foregoing description, the invention made by the present inventors has been explained, focused on its applications to the high frequency power amplifier circuit and power module for use in mobile phones in the background usage field of the invention, the present invention is not so limited and can be used for the high frequency power amplifier circuit and power module or the like as a component of a wireless LAN.

What is claimed is:

1. An electronic part for high frequency power amplification, comprising:
   an input terminal arranged to receive a high frequency signal;
   a power amplifying element arranged to amplify a power of said high frequency signal received from said input terminal;
   an output terminal arranged to output an output power received from said power amplifying element;
   a control signal terminal arranged to receive an output level control signal;
   an output power control circuit arranged to control a level of said output power in accordance with said output level control signal;
   a first power supply terminal arranged to supply a first power supply voltage to said power amplifying element; and
   a second power supply terminal arranged to supply a second power supply voltage to said output power control circuit;
   wherein the output power level is a first power level at a first timing at which said first power supply voltage is being supplied to said first power supply terminal, before said second power supply voltage is supplied to said second power supply terminal, and said output level control signal is at a first signal level,
   wherein the output power level remains at said first power level from said first timing until a second timing at which said first power supply voltage is being supplied to said first power supply terminal, said second power supply voltage begins to be supplied to said second power supply terminal, and said output level control signal is at said first signal level,
   wherein said output level control signal remains at said first signal level from said second timing until a third timing at which, in response to said second power supply voltage being supplied to said second power supply terminal, the output power level is a second power level which is higher than said first power level,
   wherein said output level control signal remains at said first level from said third timing until a fourth timing at which said output level control signal begins to change from said first signal level, and
   wherein the output power level rises in accordance with changing of said output level control signal from said fourth timing until a fifth timing.

2. An electronic part for high frequency power amplification according to claim 1,
   wherein said output level control signal rises from said fourth timing until said fifth timing.

3. An electronic part for high frequency power amplification according to claim 1, further comprising plural ones of said power amplifying element in cascade,
   wherein said control circuit is arranged to control a final one of said power amplifiers in said cascade.

4. An electronic part for high frequency power amplification according to claim 1,
   wherein said control circuit includes a precharge circuit so as to control the output power level being said second power level from said third timing to said fourth timing.

5. An electronic part for high frequency power amplification according to claim 1,
wherein said electronic part for high frequency power amplification comprises a plurality of semiconductor chips.

6. An electronic part for high frequency power amplification according to claim 1,
wherein said electronic part for high frequency power amplification comprises one semiconductor chip.

7. An electronic part for high frequency power amplification, comprising:
an input terminal arranged to receive a high frequency signal;
a power amplifying element arranged to amplify a power of said high frequency signal received from said input terminal;
an output terminal arranged to output an output power received from said power amplifying element;
a control signal terminal arranged to receive an output level control signal;
an output power control circuit arranged to control a level of said output power in accordance with said output level control signal;
a first power supply terminal arranged to supply a first power supply voltage to said power amplifying element; and
a second power supply terminal arranged to supply a second power supply voltage to said output power control circuit;
wherein an operation of said electronic part for high frequency power amplification is controlled by a plurality of periods,
said plurality of periods includes a first period, a second period and a third period,
wherein said second period is later than said first period and said third period is later than said second period,
wherein said first power supply voltage is being supplied to said first power supply terminal before said second power supply voltage is being supplied to said second power supply terminal, said output level control signal is a first signal level, and the output power level is a first power level in said first period,
wherein said first power supply voltage is being supplied to said first power supply terminal, said second power supply voltage is being supplied to said second power supply terminal, said output level control signal is said first signal level, and the output power level is a second power level which is higher than said first power level in said second period, and
wherein said first power supply voltage is being supplied to said first power supply terminal, said second power supply voltage is being supplied to said second power supply terminal, said output level control signal changes from said first signal level to a second signal level, and the output power level rises from a second power level to a third power level in said third period.

8. An electronic part for high frequency power amplification according to claim 7,
wherein said second signal level is higher than said first signal level.

9. An electronic part for high frequency power amplification according to claim 7, further comprising plural ones of said power amplifying element in cascade,
wherein said control circuit is arranged to control a final one of said power amplifiers in said cascade.

10. An electronic part for high frequency power amplification according to claim 7,
wherein said control circuit includes a precharge circuit so as to control the output power level being said second power level in said second period.

11. An electronic part for high frequency power amplification according to claim 7,
wherein said electronic part for high frequency power amplification comprises a plurality of semiconductor chips.

12. An electronic part for high frequency power amplification according to claim 7,
wherein said electronic part for high frequency power amplification comprises one semiconductor chip.

* * * * *